United States Patent [19]

Imamiya et al.

[11] Patent Number: 4,951,257
[45] Date of Patent: Aug. 21, 1990

[54] REFERENCE SETTING CIRCUIT FOR DETERMINING WRITTEN-IN CONTENT IN NONVOLATILE SEMICONDUCTOR MEMORIES

[75] Inventors: Keniti Imamiya, Yokohama; Sumio Tanaka, Oomorinishi; Junichi Miyamoto, Yokohama; Shigeru Atsumi, Tokyo; Yumiko Iyama; Nobuaki Ohtsuka, both of Yokohama, all of Japan

[73] Assignee: Kabushiki Kaisha Toshiba, Kawasaki, Japan

[21] Appl. No.: 197,437

[22] Filed: May 23, 1988

[30] Foreign Application Priority Data

May 27, 1987 [JP] Japan .................................. 62-130805

[51] Int. Cl.$^5$ ........................ G11C 11/40; G11C 13/00
[52] U.S. Cl. .............................. 365/210; 365/189.05; 365/189.09; 365/230.08
[58] Field of Search .............. 365/210, 189.05, 189.09, 365/230.06, 230.08

[56] References Cited

U.S. PATENT DOCUMENTS 4,223,394  9/1980  Pathak et al. ..................... 365/210

Primary Examiner—Terrell W. Fears
Attorney, Agent, or Firm—Finnegan, Henderson, Farabow, Garrett and Dunner

[57] ABSTRACT

A nonvolatile semiconductor memory according to this invention is so constructed that different data readout references are used in an ordinary readout mode and in a program verification mode. The different read-out references can be set by changing reference input potential VREF supplied to a differential sense amplifier for amplifying a potential derived onto a bit line from a memory cell, or by changing an input threshold level of a circuit for sensing the potential on the bit line. In this case, the readout reference in the program verification mode is set severe, or high, in comparison with that in the ordinary readout mode.

7 Claims, 4 Drawing Sheets

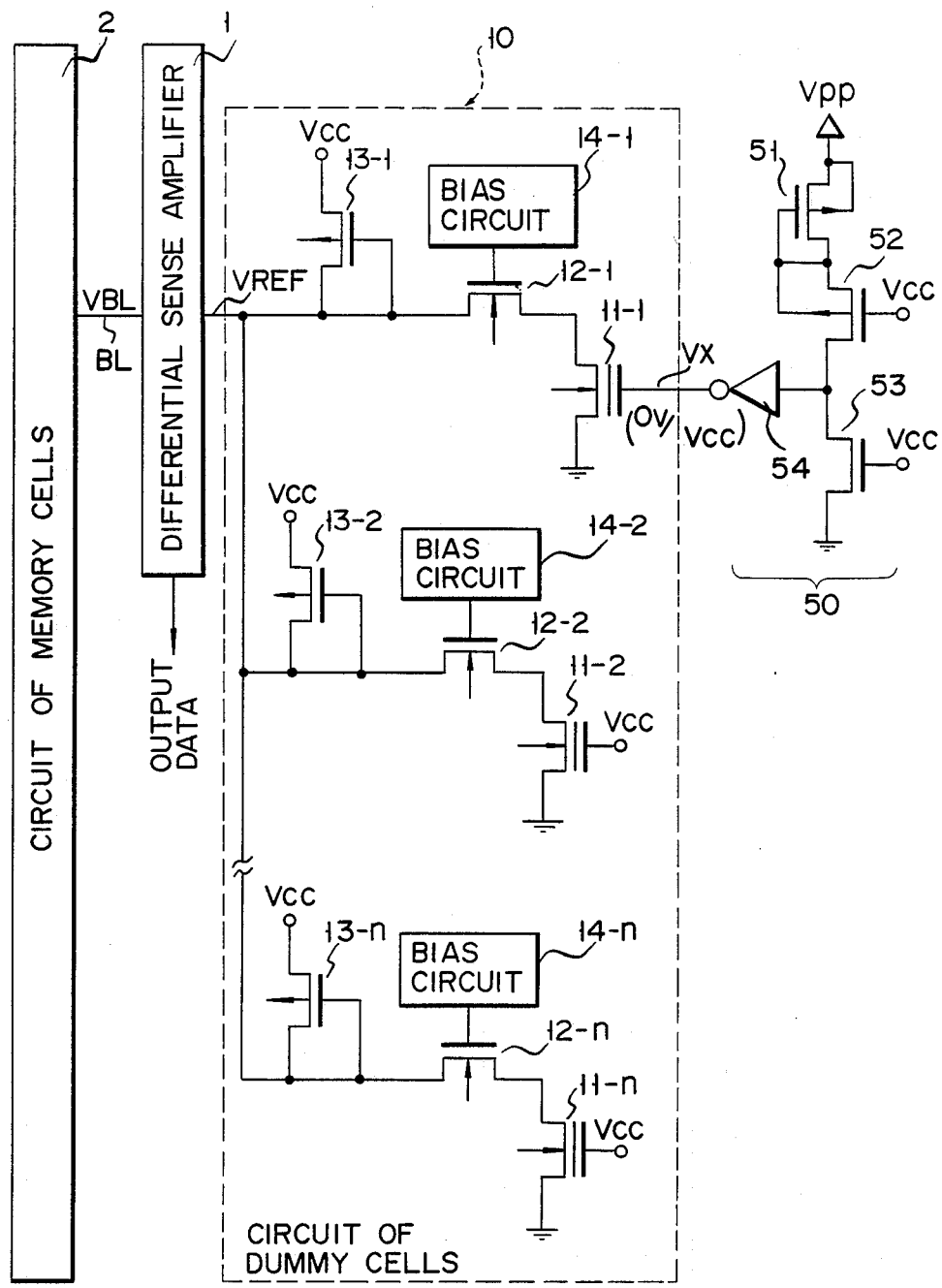
F I G. 1

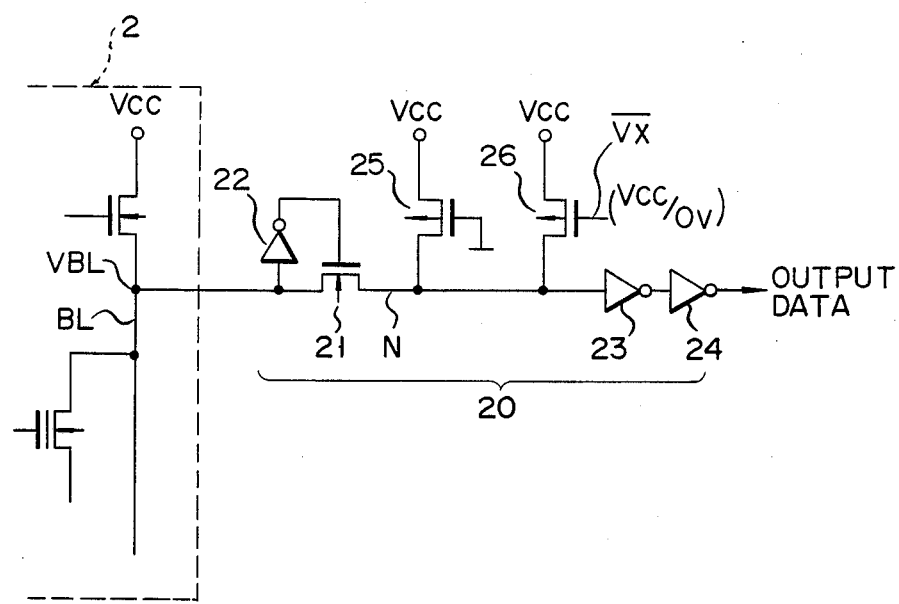
F I G. 2

REFERENCE SETTING CIRCUIT FOR DETERMINING WRITTEN-IN CONTENT IN NONVOLATILE SEMICONDUCTOR MEMORIES

BACKGROUND OF THE INVENTION

1. Field of the Invention

This invention relates to a nonvolatile semiconductor memory, and more particularly, to a circuit for setting a severe, or rigorous, reference used in a program verification mode for determining whether or not data has been flawlessly written into a memory cell.

2. Description of the Related Art

In a conventional EPROM (ultraviolet erasable and programmable read only memory), differential sense amplifier 1, as shown in FIG. 3, is used to sense a potential, which is derived from the memory cell and set on a bit line. Sense amplifier 1 is connected to receive bit line potential VBL as a first input (comparison input), and reference potential VREF, from dummy cell circuit 30, as the other input (reference input).

Dummy cell circuit 30 is of substantially the same construction as memory cell (EPROM) circuit 2, and comprises a preset number of basic circuits, which are connected in parallel to attain a desired output level, and which include dummy cell 11, potential clamping MOS transistor 12, and load MOS transistor 13.

In this case, the gate of dummy cell 11 is connected to receive a "1" level voltage (ordinary power source voltage Vcc). Therefore, in the case of the above EPROM, the same reference input potential VREF for sense amplifier 1 is used in the ordinary readout operation and the program verification operation (which is a readout operation effected to verify the written-in contents immediately after the write-in operation).

An EPROM writer for externally writing data into the EPROM does so by utilizing a specified access manner. Therefore, even if correct readout data is obtained in the verification operation, the write amount (or degree of writing data) is not always sufficient, that is, data is not always written in perfect condition. In other words, it is not always ensured that a sufficiently large power source voltage margin can be obtained in an ordinary readout operation.

SUMMARY OF THE INVENTION

The purpose of this invention is to solve the problems related to the fact that data cannot always be written perfectly into a nonvolatile memory cell, and the power source voltage margin in the ordinary readout operation may be set small; therefore, an object of this invention is to provide a reference setting circuit for determining the written-in contents of a nonvolatile semiconductor memory in which data can always be flawlessly written into nonvolatile memory cells, and a sufficiently large power source voltage margin can be obtained in all the access operations including an ordinary readout operation.

A nonvolatile semiconductor memory according to this invention is so constructed that data readout references used in an ordinary readout mode differ from those used in the program verification mode. These different readout references can be set by changing reference input potential VREF supplied to a differential sense amplifier for amplifying a potential derived onto a bit line from a memory cell, or by changing an input threshold level of a circuit for sensing the potential on the bit line. In this case, the readout reference in the program verification mode is set severe or high in comparison with that in the ordinary readout mode.

With the construction described above, the readout reference in the program verification mode is set severe or high, and therefore data can only be correctly read out when data has been flawlessly written into the memory cell. In other words, data can be perfectly written by repetitively writing data until data can be read out correctly in the program verification mode. As a result, a sufficiently large power source voltage margin can be obtained in all the access operations including an ordinary readout operation.

BRIEF DESCRIPTION OF THE DRAWINGS

FIG. 1 shows a reference setting circuit, for determining the written-in contents of nonvolatile semiconductor memories, according to one embodiment of the present invention;

FIG. 2 shows the main portion of a reference setting circuit, for determining the written-in contents of nonvolatile semiconductor memories, according to another embodiment of this invention;

DETAILED DESCRIPTION OF THE PREFERRED EMBODIMENTS

Figure 3:
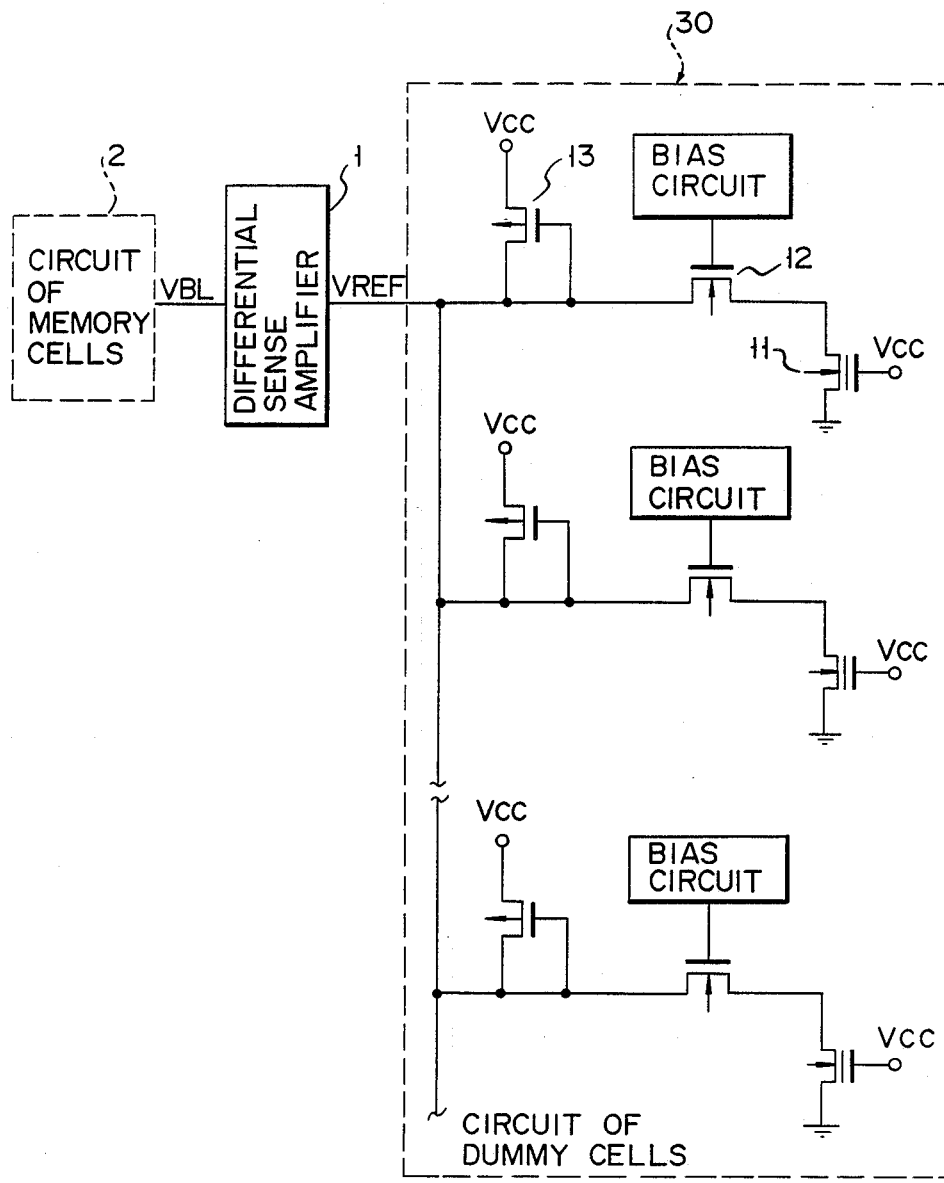
FIG. 3 shows a conventional reference setting circuit for determining written-in contents.

An embodiment of the present invention will now be described, with reference to the accompanying drawings.

FIG. 1 shows part of an EPROM. In FIG. 1, reference number "1" denotes a differential sense amplifier for reading out data from memory cells. The input potential (bit line potential VBL) from memory cell circuit 2 and reference input potential VREF from dummy cell circuit 10 (reference potential generating circuit) are supplied to sense amplifier 1 as differential inputs, and thus the memory cell data is read out by means of sense amplifier 1. Dummy cell circuit 10 has substantially the same construction as memory cell circuit 2, and includes a preset number (n) of basic circuits which are connected in parallel to obtain a desired output level and each of which is formed of dummy cell 11-i (i=1 to n), clamping MOS transistor 12-i, and load MOS transistor 13-i. The gate of clamping MOS transistor 12-i is connected to receive a predetermined bias voltage from bias circuit 14-i.

In this embodiment, the gate of dummy cell 11-1 of at least one (11-1 to 14-1) of the basic circuits in dummy cell circuit 10 is connected to receive a ground potential (0 V) in the program verification mode and power source voltage Vcc in the ordinary readout mode. The gates of dummy cells 11-2 to 11-n of the remaining basic circuits are always connected to receive power source voltage Vcc.

The operation mode is determined in accordance with whether or not a preset write-in voltage is applied to write-in power source terminal Vpp of the memory. Circuit 50 for changing gate potential Vx of dummy cell 11-1, according to respective operation modes, can be formed as shown in FIG. 1 or by utilizing a circuit disclosed in U.S. Pat. No. 4,223,394 (Pathak et al.), for example. All the Disclosures of the U.S. Patent are incorporated in this invention by reference.

Gate potential changing circuit 50 includes a series circuit made up of MOS transistors 51 to 53 connected between write-in power source terminal Vpp and the ground terminal, and inverter 54 having an input terminal connected to a connection node between MOS transistors 52 and 53.

Assume that a gate input threshold voltage of each of MOS transistors 52 and 53 is Vth. Then, a high potential of approximately (Vcc+2Vth) is applied to terminal Vpp during the data write-in mode. At this time, an input potential of inverter 54 is set at a high level (Vcc), and output potential Vx of inverter 54 is set at a low level (ground potential).

In the above EPROM, dummy cell 11-1, the gate of which receives ground potential Vx (=0 V) in the program verification mode, is turned off, and the reference potential obtained at this time is expressed by VREF2. In contrast, dummy cell 11-1, the gate of which receives potential Vx (=Vcc) in the ordinary readout mode, is turned on, and the reference potential obtained at this time is expressed by VREF1. In this manner, the relation VREF1<VREF2 is obtained. In other words, in the program verification mode, reference input potential VREF applied to sense amplifier 1 is set at VREF2, which is higher than the reference input potential of the ordinary readout mode. This relation corresponds to the case wherein bit line potential VBL of memory circuit 2 is set at a higher level when a memory cell is selected in which data is written. In other words, the reference for determining whether or not data has been correctly written into the memory cell is set more rigidly. In this way, a rigorous, or severe, readout reference is set in the program verification mode. Thus, data can be flawlessly written by repeatedly writing the data by use of a quick program system, for example, until correct readout data is obtained. Thus, a sufficiently large power source voltage margin can be attained for all accessing operations, including the ordinary readout operation.

The circuit for changing the data readout reference in the program verification mode and the ordinary readout mode is not limited to the above embodiment, and can be variously modified. For example, as is shown in FIG. 2, it is possible to change the input threshold value of readout circuit 20 for reading out a bit line potential. In FIG. 2, "BL" denotes a bit line of memory cell circuit 2; reference numeral 21 denotes an N-channel transistor which is connected at one terminal to bit line BL; and reference numeral 22 denotes an inverter having an input terminal connected to the one terminal of transistor 21 and an output terminal connected to the gate of transistor 21. Inverter 22 controls the conduction state of transistor 21, in accordance with input potential (VBL). The other terminal (node N) of transistor 21 is connected to two-stage inverters 23 and 24, and load transistor 25 is connected between node N and the Vcd power source node.

P-channel transistor 26 is connected between node N and the Vcc power source node. The gate potential $\overline{Vx}$ of transistor 26 is set at a Vcc potential in the program verification mode and at a ground potential (0 V) in the ordinary readout mode.

In the circuit of FIG. 2, transistor 26 is turned on to raise the potential of node N in the ordinary readout mode, and is turned off to inhibit the above voltage step-up operation from occurring in the program verification mode, thus making the data readout reference more severe.

Substantially the same effect as described above can be attained by excluding transistor 26 from the circuit and changing the input threshold voltage of the first stage of two-stage inverters 23 and 24 in the program verification mode and the ordinary readout mode.

Figure 4:
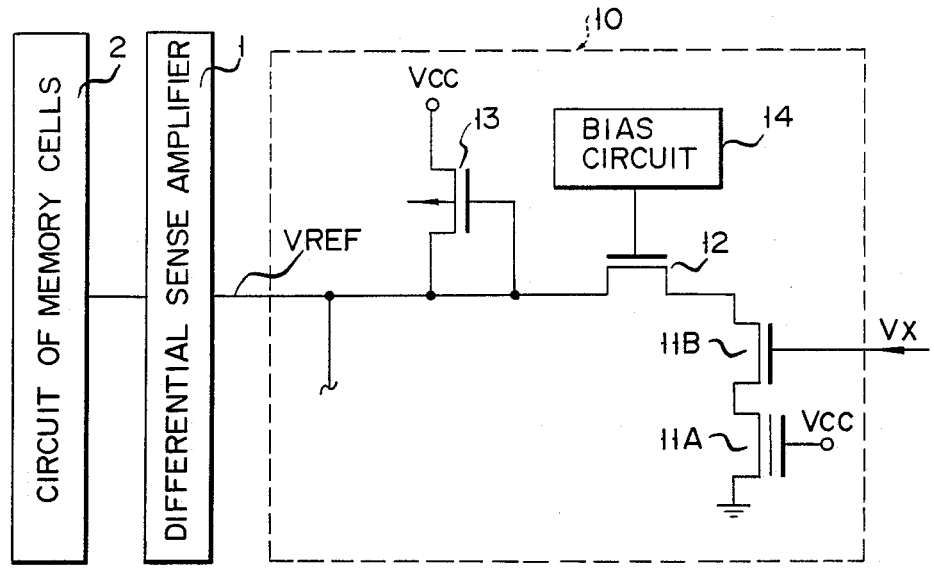
FIG. 4 is a modification of the reference setting circuit as shown in FIG. 1.

FIG. 4 is a modification of the reference setting circuit (11 to 14) shown in FIG. 1. In FIG. 4, a series circuit made up of transistors 11A and 11B is used instead of dummy cell transistor 11-1 used in FIG. 1. The gate potential of transistor 11A is set at potential Vcc and that of transistor 11B is set at potential Vx. The variation in reference potential VREF in the embodiment of FIG. 4, which is caused by changing potential Vx in the program verification mode and in the ordinary readout mode, may be substantially the same as the variation in reference VREF in the embodiment of FIG. 1.

Figure 5:
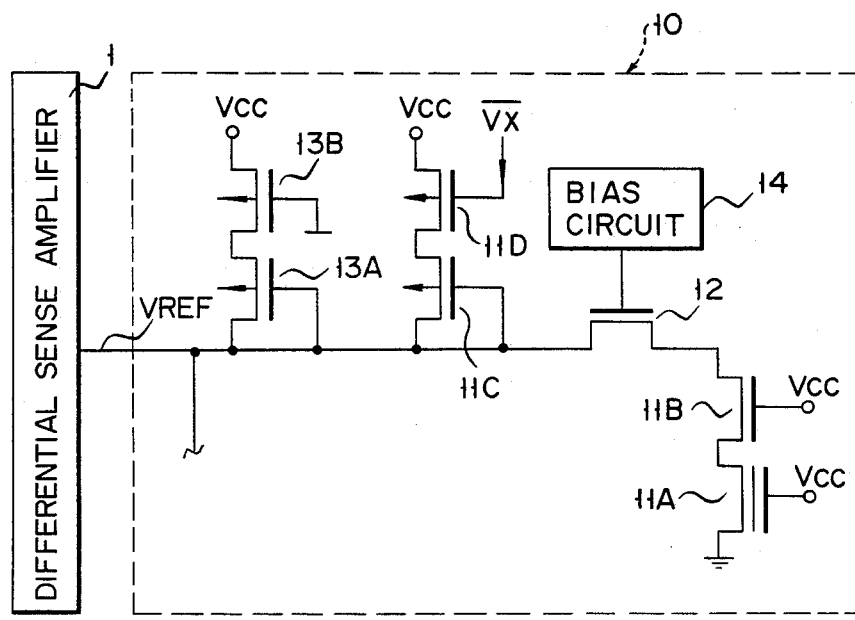
FIG. 5 is another modification of the reference setting circuit for determining the written-in contents shown in FIG. 1.

FIG. 5 is another modification of the reference setting circuit (11 to 14) shown in FIG. 1. In FIG. 5, the gate potential of transistor 11B in FIG. 4 is fixed at Vcc, a series circuit made up of transistors 13A and 13B is used instead of transistor 13 used in FIG. 4, and a series circuit made up of transistors 11C and 11D is connected in parallel with that made up of transistors 13A and 13B. Potential $\overline{Vx}$, which is set at different levels in the program verification mode and ordinary readout mode, is applied to the gate of transistor 11D. Variation in reference potential VREF in the embodiment of FIG. 5, which is caused by changing potential $\overline{Vx}$, may be substantially the same as the variation in reference potential VREF in the embodiment of FIG. 1.

This invention is not limited to the above EPROM, and can be applied, for example, to an electrically erasable and programmable read only memory (EEPROM) and a nonvolatile RAM (NVRAM) in which the contents of a RAM can be held by using an EEPROM as a back-up memory.

As described above, according to the reference setting circuit for determining the written-in contents of a nonvolatile semiconductor memory, correct readout data cannot be obtained in the program verification mode if data has been written-in in an unsatisfactory manner. In other words, if data writing is repeated until correct readout data is obtained in the program verification mode, it can be ensured that the data has been written-in in a satisfactory manner, and a sufficiently larger power source voltage margin can be attained in all the access operations, including the ordinary readout operation.

What is claimed is:
1. A reference setting circuit for determining written-in contents of a nonvolatile semiconductor memory, comprising:
   a memory cell means for storing data of the nonvolatile semiconductor memory, said memory cell means operable in an ordinary readout mode and a program verification mode in which the contents written in said memory cell means are verified; and
   data readout means, connected to said memory cell means, for reading data from the memory cell means, and including reference changing means, connected to the memory cell means, for setting different references used for determining data in the ordinary readout mode and in the program verification mode.

2. A circuit according to claim 1, wherein said data readout means includes sense amplifier means for comparing a bit line potential at a bit line of said memory cell means and the reference potential, to read out data from said memory cell means; and
   wherein said reference changing means includes reference potential generating means, connected to said sense amplifier means, for generating the reference potential; and
   potential changing means, connected to said reference potential generating means, for changing the reference potential according to whether the program verification mode or ordinary readout mode is active.

3. A circuit according to claim 1, wherein said data readout means includes sense amplifier means for detecting a bit line potential at a bit line of said memory cell means by use of a predetermined input threshold value, thereby reading out data from said memory cell means; and
   said reference changing means includes threshold changing means connected to said sense amplifier means, for changing the input threshold value according to whether the program verification mode or ordinary readout mode is active.

4. A reference setting circuit for determining the written-in contents of a nonvolatile semiconductor memory, comprising:
   a memory cell means for storing data of the nonvolatile semiconductor memory, said memory cell means operable in an ordinary readout mode and in a program verification mode in which the contents written in said memory cell means are verified;
   sense amplifier means for comparing a bit line potential at a bit line of said memory cell means and a reference potential, to read out data from said memory cell means; and
   a dummy cell means, connected to said sense amplifier means, and including reference changing means, connected to the memory cell means, for setting different references used for determining data in the ordinary readout mode and in the program verification mode.

5. A reference setting circuit for determining the written-in contents of a nonvolatile semiconductor memory, comprising:
   a memory cell means for storing data of the nonvolatile semiconductor memory, said memory cell means operable in an ordinary readout mode and in a program verification mode in which the contents written in said memory cell means are verified;
   sense amplifier means for comparing a bit line potential at a bit line of said memory cell means and a reference potential, to read out data from said memory cell means; and
   a dummy cell means connected to said sense amplifier means and including reference changing means, connected to the memory cell means, for setting different references used for determining data in the ordinary readout mode and in the program verification mode in which the contents written in said memory cell means are verified, the reference changing means including:
   variable potential generating means for generating a reference potential selection signal that is set to a first logic level in the program verification mode and to a second logic level in the ordinary readout mode;
   a first MOS transistor, having a source connected to a first circuit kept at a potential corresponding to the first logic level and a gate connected to receive the reference potential selection signal;
   a second MOS transistor, connected to said sense amplifier means and connected between a circuit to which is applied the reference potential and to a second circuit kept at a potential corresponding to the second logic level; and
   a third MOS transistor, having a gate that is set at a preset bias potential and a drain-source path connected between the circuit, to which is applied the reference potential, and a drain of said first MOS transistor.

6. A reference setting circuit for determining the written-in contents of a nonvolatile semiconductor memory, comprising:
   a memory cell means for storing data of the nonvolatile semiconductor memory, said memory cell means operable in an ordinary readout mode and in a program verification mode in which the contents written in said memory cell means are verified;
   sense amplifier means for comparing a bit line potential at a bit line of said memory cell means and a reference potential, to read out data from said memory cell means; and
   a dummy cell means connected to said sense amplifier means and including reference changing means, connected to the memory cell means, for setting different references used for determining data in the ordinary readout mode and in the program verification mode in which the contents written in said memory cell means are verified, the reference changing means including:
   variable potential generating means for generating a reference potential selection signal that is set to a first logic level in the program verification mode and to a second logic level in the ordinary readout mode;
   a first MOS transistor, having a source connected to a first circuit kept at a potential corresponding to the first logic level and a gate set at a potential corresponding to the second logic level;
   a second MOS transistor, having a source connected to the drain of said first MOS transistor and a gate connected to receive the reference potential selection signal;
   a third MOS transistor, connected to said sense amplifier means and connected between a circuit, to which is applied the reference potential, and a second circuit kept at a potential corresponding to the second logic level; and
   a fourth MOS transistor, having a gate that is set at a preset bias potential and a drain-source path connected between the circuit, to which is applied the reference potential, and the drain of said second MOS transistor.

7. A reference setting circuit for determining the written-in contents of a nonvolatile semiconductor memory, comprising:
   a memory cell means for storing data of the nonvolatile semiconductor memory, said memory cell means operable in an ordinary readout mode and in a program verification mode in which the contents written in said memory cell means are verified;
   sense amplifier means for comparing a bit line potential at a bit line of said memory cell means and a reference potential, to read out data from said memory cell means; and a dummy cell means connected to said sense amplifier means and including reference changing means, connected to the memory cell means, for setting different references used for determining data in the ordinary readout mode and in the program verification mode in which the contents written in said memory cell means are verified, the reference changing means including:

variable potential generating means for generating a reference potential selection signal that is set to a first logic level in the program verification mode and to a second logic level in the ordinary readout mode;

a first MOS transistor, having a source connected to a first circuit kept at a potential corresponding to the first logic level and a gate set at a potential corresponding to the second logic level;

a second MOS transistor, having a source connected to the drain of said first MOS transistor and a gate set at a potential corresponding to the second logic level;

a third MOS transistor, having a gate set at a preset bias potential and a drain-source path connected between the circuit that is to have the reference potential applied thereto, and the drain of said second MOS transistor;

a first transistor circuit, connected to said sense amplifier means and connected between a circuit that is to have the reference potential applied thereto, and a second circuit kept at a potential corresponding to the second logic level; and a second transistor circuit, connected to the circuit to which the reference potential is applied and to said second circuit, for changing the reference potential in accordance with the logic level of the reference potential selection signal.

* * * * *